(12) United States Patent
Ervin (10) Patent No.: US 10,443,384 B2
(45) Date of Patent: Oct. 15, 2019

(54) KINETIC ENERGY ATOM-POWERED ENGINE

(71) Applicant: Lee Ervin, Tempe, AZ (US)

(72) Inventor: Lee Ervin, Tempe, AZ (US)

( * ) Notice: Subject to any disclaimer, the term of this patent is extended or adjusted under 35 U.S.C. 154(b) by 318 days.

(21) Appl. No.: 15/282,991

(22) Filed: Sep. 30, 2016

(65) Prior Publication Data

US 2017/0022814 A1     Jan. 26, 2017

Related U.S. Application Data

(63) Continuation of application No. 14/696,266, filed on Apr. 24, 2015, now Pat. No. 9,470,090, which is a
(Continued)

(51) Int. Cl.

| | |
|---|---|
| *F01D 1/18* | (2006.01) |
| *B81B 5/00* | (2006.01) |
| *F03B 17/00* | (2006.01) |
| *F01D 25/00* | (2006.01) |
| *F01D 25/14* | (2006.01) |

(52) U.S. Cl.
CPC .............. *F01D 1/18* (2013.01); *B81B 5/00* (2013.01); *F01D 25/005* (2013.01); *F01D 25/14* (2013.01); *F03B 17/00* (2013.01); *B81B 2201/03* (2013.01); *B81B 2201/034* (2013.01);
(Continued)

(58) Field of Classification Search
CPC ....... B81B 3/0024; B81B 5/00; B81B 7/0035; B81B 7/0083; B81B 7/009; B81B 7/0096; B81B 2201/03; B81B 2201/031; B81B 2201/038; B81B 2203/051;
(Continued)

(56) References Cited

U.S. PATENT DOCUMENTS

| | | | | |
|---|---|---|---|---|
| 6,067,858 A | * | 5/2000 | Clark | ................ G01C 19/5719 |
| | | | | 73/504.16 |
| 7,038,335 B2 | * | 5/2006 | Choi | ...................... B06B 1/045 |
| | | | | 310/12.24 |

(Continued)

OTHER PUBLICATIONS

Eshuis et al., "Experimental Realization of a Rotational Ratchet in a Granular Gas", Jun. 18, 2010, The American Physical Society, Physical Review Letters 104, 248001, pp. 1-4 (Year: 2010).*

*Primary Examiner* — Carlos A Rivera
*Assistant Examiner* — Alexander A White
(74) *Attorney, Agent, or Firm* — Quarles & Brady LLP (57) ABSTRACT

A device for converting the kinetic energy of molecules into useful work includes an actuator configured to move within a fluid or gas due to collisions with the molecules of the fluid or gas. The actuator has dimensions that subject it to the Brownian motion of the surrounding molecules. The actuator utilizes objects having multiple surfaces where the different surfaces result in differing coefficients of restitution. The Brownian motion of surrounding molecules produce molecular impacts with the surfaces. Each surface then experiences relative differences in transferred energy from the kinetic collisions. The sum effect of the collisions produces net velocity in a desired direction. The controlled motion can be utilized in a variety of manners to perform work, such as generating electricity or transporting materials.

20 Claims, 4 Drawing Sheets

Related U.S. Application Data continuation of application No. 13/336,881, filed on Dec. 23, 2011, now Pat. No. 9,039,359.

(60) Provisional application No. 61/430,164, filed on Jan. 5, 2011.

(52) U.S. Cl.
CPC ........... *B81B 2203/06* (2013.01); *Y02E 10/20* (2013.01); *Y02E 10/28* (2013.01)

(58) Field of Classification Search
CPC ........ B81B 2203/053; B81B 2203/055; B81B 2203/056; B81B 2203/06; F03B 17/062
USPC .................... 415/90, 182.1; 416/1, 4, 231 R; 977/707, 712, 724, 725, 730, 796, 810, 977/948
See application file for complete search history.

(56) References Cited

U.S. PATENT DOCUMENTS

| | | | | |
|---|---|---|---|---|
| 2003/0151257 A1* | 8/2003 | Pinkerton | ............... | G01K 7/028 290/1 R |
| 2005/0069424 A1* | 3/2005 | Lu | ........................... | F04B 7/003 417/322 |

\* cited by examiner

KINETIC ENERGY ATOM-POWERED ENGINE

CROSS-REFERENCE TO RELATED APPLICATIONS

This application is a continuation and claims the benefit of U.S. patent application Ser. No. 14/696,266, filed Apr. 24, 2015, which is a continuation claiming the benefit of U.S. patent application Ser. No. 13/336,881, filed Dec. 23, 2011, now U.S. Pat. No. 9,039,359, which claims the benefit of U.S. Provisional Pat. App. Ser. No. 61/430,164, filed Jan. 5, 2011, all of which applications are incorporated herein in their entirety by reference.

FIELD OF INVENTION

This invention relates to nanometer-scale electromechanical systems. This invention relates particularly to systems using a nanometer-scale engine to convert the kinetic energy of molecules in a gas or fluid into useful work.

BACKGROUND

Brownian motion is the random motion of molecules in a gas or fluid due to the kinetic energy of the molecules. The kinetic energy, and thus the motion, of a molecule is directly related to its temperature, with a warmer molecule having more kinetic energy. The kinetic energy E of a molecule, measured in joules, is given by the formula:

$$E = 3/2 k \ast T$$

where T is the absolute temperature, in degrees Kelvin, of the molecule and k is the Boltzmann constant of $1.38 \ast 10^{-23}$ J/K. In a gas or fluid at room temperature of about 23 degrees Celsius, or 296K, a single molecule has kinetic energy of about $6.13 \ast 10^{-21}$ J.

Since the discovery of Brownian motion, many attempts have been made to design an apparatus that "taps into" the kinetic energy of molecules, using it as fuel to generate electricity, to propel a structure, or to perform other tasks. Such an apparatus must itself be subject to Brownian motion and therefore must be, or have components that are, microscopic or smaller in size. A Brownian-level apparatus was only theorized until the recent advent of technologies, such as microelectromechanical systems ("MEMS") technology, that allow the construction of discrete articles at a suitably small scale. In one recent potential solution, U.S. Pat. No. 7,495,350 describes an array of beams measuring only a few nanometers across, wherein a particle that collides with a beam imparts some of its kinetic energy onto the beam, causing the beam to bend and then oscillate as it returns to its original position. The motion of the beam generates a small but measurable current in attached circuitry.

It would be advantageous to provide a device that converts the Brownian motion of molecules into rotational or revolving movement, in order to efficiently produce electricity as well as to directly operate pumps, wheels, axles, and other devices requiring rotational motion. One well-known example is the generically-termed "Brownian motor," which includes a paddle wheel connected to a ratchet and pawl. The ratchet and pawl theoretically restrict the rotation of the paddle wheel to one direction, so that impacts of molecules on the paddle wheel's paddles cause one-way rotation of the wheel in discrete steps. This design has two primary drawbacks. Most importantly, it has been shown that the ratchet and pawl must also be at the nanoscale and are therefore also subject to Brownian motion. As a result, when the paddle wheel, ratchet, and pawl are at the same temperature, there is no net motion of the paddle wheel, and in fact the pawl is subject to failure that causes the paddle wheel to rotate in the opposite direction. The pawl and ratchet must be maintained at a lower temperature than the paddle wheel, which requires external application of energy to the system. The other main drawback is that, assuming a functioning device, the paddle wheel moves in discrete increments rather than moving continuously. A nano-scale engine that rotates or revolves substantially continuously without a temperature gradient is needed.

Therefore, it is an object of this invention to provide an apparatus for converting the kinetic energy of a molecule into useful work. It is a further object that the apparatus generate useful work from the Brownian motion of molecules in a gas or fluid. It is a further object that the apparatus generates the work through rotational or revolving motion. It is another object of the invention to provide an apparatus that converts the kinetic energy of molecules into electricity. It is another object of the invention to provide an apparatus that converts the kinetic energy of molecules into rotational motion for powering a rotary device. It is a further object that the apparatus power a nano-scale rotary device. It is still another object of the invention to provide an apparatus that moves, in a substantially controlled manner, due collisions with surrounding molecules. It is a further object of the invention to use the movement to transport a material along a path.

SUMMARY OF THE INVENTION

An apparatus for converting molecular kinetic energy into useful work includes a housing that encloses a gas or fluid and an actuator immersed in the gas or fluid. The gas or fluid may be contained in the housing under pressure. The actuator is small enough to be directly affected by the Brownian motion of the molecules in the fluid or gas, specifically between a few nanometers and 100 micrometers in total length. The actuator is configured to move in response to molecular collisions. The actuator has at least one leading face and at least one trailing face, the leading and trailing faces being offset from each other by an angle of more than 180 degrees. In the preferred embodiment, each leading face is parallel to and facing away from a trailing face. The leading face is substantially composed of a first material and the trailing face is substantially composed of a second material having a coefficient of restitution, with respect to the molecules of the gas or fluid, which is substantially lower than the coefficient of restitution of the first material. Preferably, the coefficient of restitution of the first material is approximately 1.0, and the coefficient of restitution of the second material is substantially close to zero.

The Brownian motion of the molecules in the gas or fluid causes them to collide with each other, with the walls of the housing, and with the leading and trailing faces of the actuator. Due to the arrangement of the first and second materials, the molecular collisions with the trailing face impart a greater momentum on the actuator than the molecular collisions with the leading face, causing the actuator to move. The kinetic energy of the actuator may then be used to perform other work. Suitable uses include: constraining the actuator to circular movement to operate a wheel, turbine, pulley, pump, or another device that may directly employ the movement; converting movement along a closed loop to linear motion to operate a pushrod or gate; attaching a magnetic material to the actuator and placing an inductor in proximity to create a magnetic flux; using movement of the actuator along a path to transport a material; or simply dissipating heat within the gas or fluid. The housing may be made of a material having good properties of heat transfer, so that a gas or fluid outside the housing may be used to heat the gas or fluid inside the housing. The invention contemplates arrangements of the housing-actuator assembly in arrays of several thousand to several billion or more assemblies, according to design requirements.

DETAILED DESCRIPTION OF THE INVENTION

Figure 1:
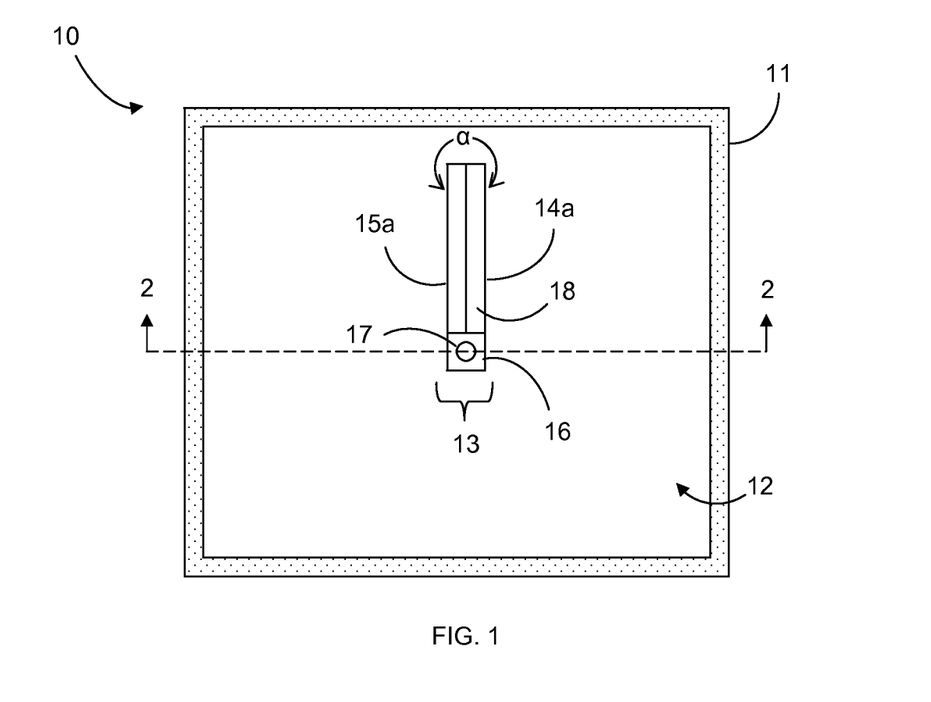
FIG. 1 is a plan view of a first embodiment of the invention, showing an actuator with one blade.
Figure 2:
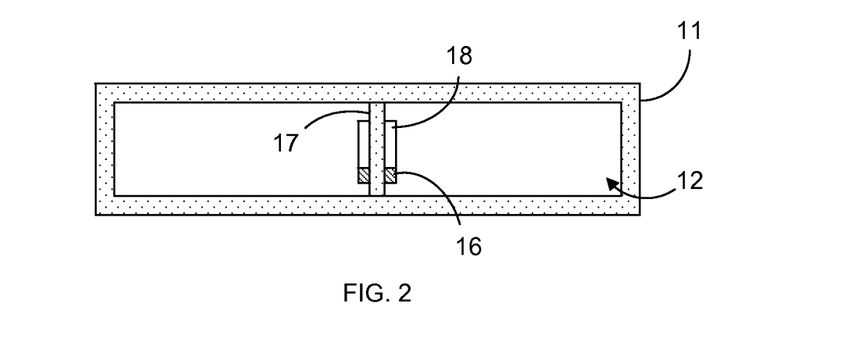
FIG. 2 is a cross-sectional view of the first embodiment of the invention, taken along line 2-2 of FIG. 1.

Referring to FIGS. 1 and 2, there is illustrated a first embodiment of the present invention designated generally as 10 which is used to convert the kinetic energy of molecules in a gas or fluid into extractable, usable kinetic energy. The device 10 comprises an actuator 13 substantially contained within a housing 11. The housing 11 is a substantially gas- and water-tight enclosure having walls that define a chamber 12 in which the actuator 13 is positioned. The housing 11 and chamber 12 may be any shape suitable for containing the actuator 13 and the gas or fluid that powers it as described below, according to the implementation of the invention. Preferably, the housing 11 is a regular or irregular hexahedron or another shape with planar sides that allow the device 10 to be stacked or placed side-by-side with other devices 10. The size of the housing 11 may be determined by the size of the actuator and the type of gas or fluid contained in the chamber 12. The housing 11 may be made of a nonpermeable material that may be manipulated at the microscopic, and preferably nanoscopic, level, such as aluminum, silicon, doped silicon, or carbon crystal. Preferably the material used has good heat transfer properties, such as aluminum or doped silicon. The wall thickness of the housing 11 is chosen to constrain the enclosed gas or fluid at a desired pressure while allowing heat to be easily transferred through the wall and also accommodating the interoperation of the actuator 13 with other components of the device 10 in certain embodiments as described below. The wall thickness may also depend on the material chosen for it. For example, a carbon crystal lattice, such as diamond, may be 1 nm or less in thickness while still retaining certain gases at pressure, while a wall made from a silicon substrate, as is known in MEMS construction, may be about 60 nm in width. One or more sealable ports (not shown) may be disposed through the walls of the housing 11 to provide access to the chamber 12 or to allow the actuator 13 to escape the housing.

The gas or fluid contained within the chamber 12 contains a known composition of molecules. Preferably, the gas or fluid is substantially pure, meaning it contains a substantially homogenous composition of a single type of molecule, because it is easier to predict an expected amount of movement and energy extraction when the molecules are the same size. However, a composition such as air, having oxygen, nitrogen, argon, and other gases therein, may be used. Further, the chosen gas or fluid must not react chemically with the material used for the housing 11 and actuator 13, in order to prevent degradation of the materials or pollution of the gas or fluid. The molecules have kinetic energy based on the average temperature of the gas or fluid. The kinetic energy of the molecules is transferred in varying amounts to the components of the device 10 as the molecules collide with the components during Brownian motion. The amount of energy transferred by a molecule to a component during a collision is directly related to the coefficient of restitution ("COR") between the material of the component and the molecule. The COR between two masses A and B may be found using the formula:

$$COR=(v_b-v_a)/(u_a-u_b)$$

where $u_a$ and $u_b$ are the initial velocities of masses A and B, respectively, and $v_b$ and $v_a$ are the final velocities of masses A and B, respectively. A COR of 1.0 represents a completely elastic collision, and a COR of 0.0 represents a completely inelastic collision. As used herein, the COR of a material used on the actuator 13 described below is defined with respect to the molecules of the enclosed gas or fluid, which collide with the actuator 13. The COR of a material is determined by the particles that comprise it and the structure in which they are arranged, said structures ranging from highly crystalline to amorphous. Commonly known material properties that affect the COR include its Young's modulus, its Poisson's ratio, and its dissipative constant, the last value being a function of the material's viscosity.

The mass of the actuator 13 must be small enough to be affected by the Brownian motion of the molecules. However, the less massive the actuator 13, the greater the velocity imparted upon the actuator 13 by the molecular impacts. A low-mass actuator 13 may be subject to significant velocity changes as the molecules randomly hit it from all directions. Preferably, therefore, the actuator 13 is large enough to minimize the magnitude of velocity changes. An appropriate mass will depend on the implementation, in particular molecular composition and density of the gas or fluid contained in the chamber 12. For example, in air the actuator 13 may weigh up to about 1 microgram, while in water the actuator 13 may weigh up to 600 micrograms. The actuator comprises at least one pair of faces, a leading face 14a and a trailing face 15a, that are substantially planar surfaces facing away from each other; that is, the angle a between the leading and trailing faces is greater than 180 degrees. Preferably, the leading face 14a is substantially parallel to and facing away from the trailing face 15a, meaning the angle between the faces is about 360 degrees. See FIG. 1.

The leading face 14a is substantially composed of a first material having a first COR and the trailing face 15a is substantially composed of a second material having a second COR that is lower than the first COR. The difference between the first and second CORs is preferably maximized, where the first COR is approximately 1.0 and the second COR is near zero. However, while the difference in CORs maximizes the efficiency of energy extraction as described below, other materials having a lower COR difference may be selected for the first and second materials for other reasons such as manufacturing costs or availability of materials. Non-exhaustive examples of possible pairings of first and second materials include a conventional solid, or crystalline, metal and an amorphous metal, a rigid crystalline material and a flexible structure, or any other combination of materials that results in a difference of CORs between the first and second materials. For comparison purposes, the materials may be chosen from diamond, silicon, and nylon, which have Young's moduli of about 1300 GPa, about 130-190 GPa, and about 2 GPa, respectively. The difference in CORs between diamond and nylon is higher than any other combination of these materials and will render the most efficient actuator 13. However, selecting silicon instead of diamond may be significantly more cost-effective even though the actuator 13 would not be as efficient. It will be understood that in any combination of materials, the first material, which comprises the leading face 14a, has a higher COR than the second material, which comprises the trailing face 15a. In alternate embodiments, the leading face 14a and trailing face 15a may be composed of a plurality of materials that, taken together, have a total COR that satisfies the requirement for a difference between the CORs of the leading face 14a and trailing face 15a. In still other embodiments, the leading face 14a and trailing face 15a may be composed of the same material having different arrangements that result in the COR of the material on the leading face 14a being higher than the COR of the material on the trailing face 15a.

Immersed in the gas or fluid contained in the chamber 12, the actuator 13 is subject to substantially constant collisions with the surrounding molecules, which have velocities dictated by temperature and the principles of Brownian motion. Conventionally, it is understood that the effect of Brownian motion of all of the molecules in a constrained gas or fluid, referred to as "thermal noise," is symmetric, meaning the net velocity of the particles is zero. However, due to the differences in CORs of the materials comprising the leading face 14a and trailing face 15a, the average kinetic energy imparted upon the actuator 13 over time causes a net velocity of the actuator 13 in one direction. Specifically, in a model where the actuator moves substantially linearly and the leading face 14a is on the right side of the actuator 13, the actuator 13 will move toward the right. See FIG. 5. The present device 10 comprises components that constrain the motion of the actuator 13 onto an open or closed path as described below with respect to particular embodiments. Thus, in the device 10, the molecular collisions with the leading and trailing faces result in the actuator 13 experiencing a net torque from the unequal transfer of kinetic energy.

Figure 3:
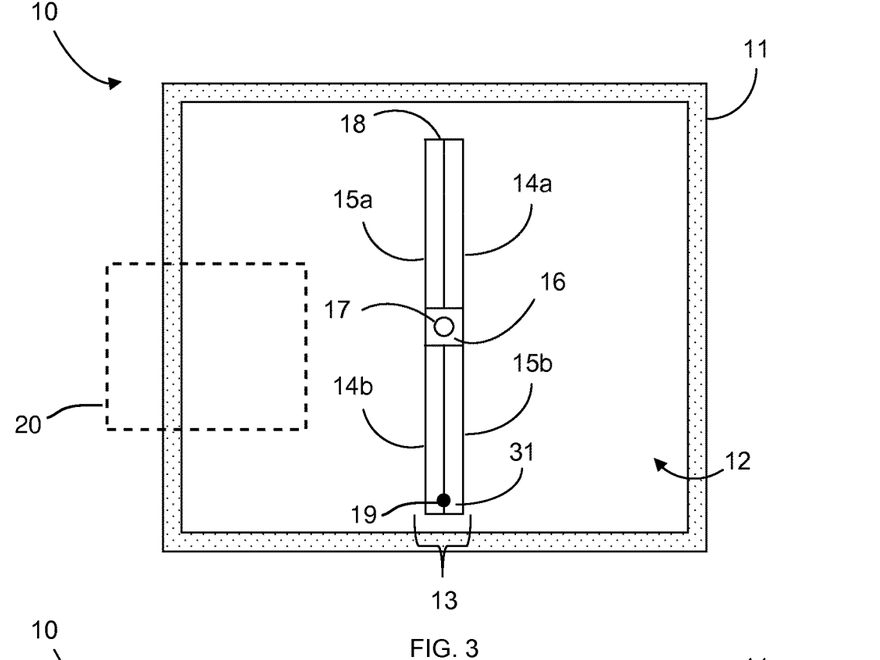
FIG. 3 is a plan view of a second embodiment of the invention, showing an actuator with two blades.
Figure 4:
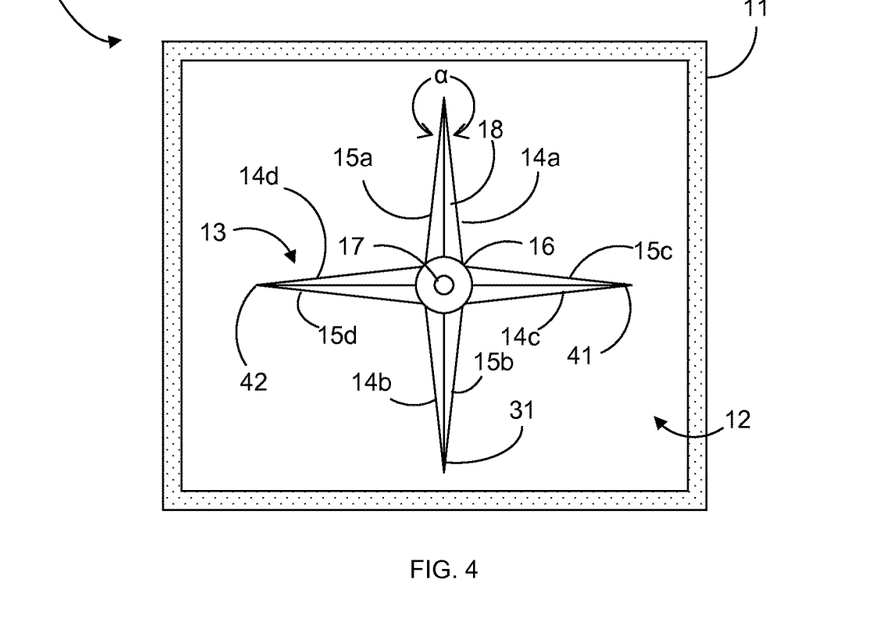
FIG. 4 is a plan view of a third embodiment of the invention, showing an actuator with four blades.

Referring again to FIGS. 1 and 2, and further to FIGS. 3 and 4, the actuator 13 may be configured to move in a circle, the circle preferably having a center near the center of the chamber 12 so as not to impact the walls of the housing 11 during movement. The actuator 13 may comprise one or more blades, each having a proximal end, a distal end, and a pair of leading and trailing faces. The blades have dimensions that are sufficiently small to be subject to Brownian motion, specifically in the range of a few nanometers to about 100 micrometers in any dimension. The blades preferably are shaped to maximize the available surface area for molecular impacts upon at least the trailing face. The blades may be attached to or integral with a base 16 at the proximal end of the blade. The base 16 may be configured to rotate around an axle 17 attached to or disposed through one or more of the walls of the housing 11. In one embodiment, the base 16 and axle 17 are separated and arranged to minimize the friction between them, and a lubricant or additional friction-reducing material may be used. In another embodiment, the base 16 is permanently attached to or integral with the axle 17, which passes out of the housing and mechanically or electrically attaches to a means for extracting the energy produced by the actuator 13, such as a sprocket or another wheel, a pulley, a turbine, a propulsion system, a pushrod assembly for converting the rotational motion of the axle 17 into reciprocal motion, or another structural component designed to use the actuator's 13 rotational energy.

The specific size, shape, and number of blades may be varied to optimize performance in a given implementation. FIGS. 1 and 2 illustrate a first embodiment wherein the actuator 13 has one blade 18 with a leading face 14a and a trailing face 15a. In the illustrated embodiment, the blade 18 is substantially hexahedral, with the leading face 14a being substantially parallel to the trailing face 15a. The blade 18 may be divided in the plane that is parallel to the leading face 14a, preferably divided in half, with the portion containing the leading face 14a being substantially comprised of the first material, and the portion containing the trailing face 15a being substantially comprised of the second material. The width of the portions may affect the COR at each of the leading face 14a and trailing face 15a, such that both portions may be made of the same flexible material and yet have different CORs in order to satisfy the requirements for the actuator 13. The portions are permanently attached to each other or are formed integrally with each other, and further are attached to or integral with the base 16. In the illustrated embodiment, the actuator 13 will spin clockwise around the axle 17, but the leading face 14a and trailing face 15a may be reversed to cause the actuator to spin counterclockwise.

FIGS. 3 and 4 illustrate a second and third embodiment, respectively, wherein the actuator 13 comprises a plurality of blades. Referring to FIG. 3, a first blade 18 may be offset from a second blade 31 by up to 180 degrees around the axle 17. The second blade 31 has a leading edge 14b and a trailing edge 15b disposed in the same arrangement as those of the first blade 18 to increase the surface area of the actuator 13 for receiving molecular impacts. Preferably, the second blade 31 is disposed opposite the first blade 18 and has the same properties as the first blade 18 to maintain symmetry of the actuator 13. However, the second blade 31 may have a different size or mass, or may be composed of different materials, if the implementation calls for it. For example, the second blade 31 may have a magnet 19 attached to it cooperating with an external device 20 to generate changes in magnetic flux (e.g., to induce an electric current) as described below, and the mass of the second blade 31 is lower than that of the magnet-free first blade 18, so that the sum of the masses of the second blade 31 and the magnet are equal to the mass of the first blade 18. A four-bladed actuator 13 is illustrated in FIG. 4. The blades 18, 31, 41, 42 may be spaced at 90-degree intervals around the base 16. As shown, one or both of the leading face 14a-d and trailing face 15a-d of each of the blades 18, 31, 41, 42 may be angled away from the opposite face, the angle a being between 180 and 360 degrees. The angle a may be chosen so that each blade 18, 31, 41, 42 ends in a point. The angular design provides for a longer trailing face 15a-d on each blade than if the trailing face 15a-d were parallel to the leading face 14a-d, for a blade with the same length. This provides more surface area for molecular impacts, which in turn may increase the efficiency with which the Brownian motion of the molecules is converted into rotational motion of the actuator 13.

Figure 5:
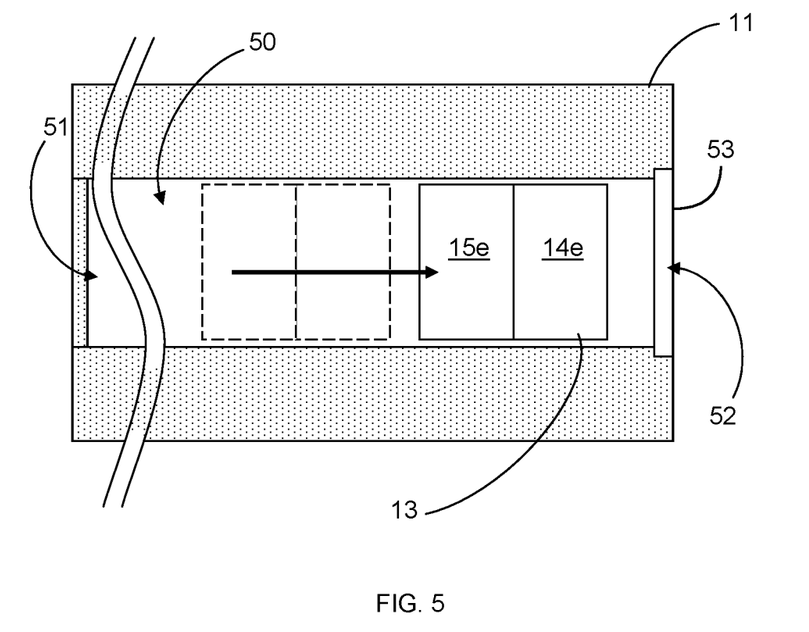
FIG. 5 is a plan view of a fourth embodiment of the invention, showing an actuator configured to travel along a linear chamber.
Figure 6:
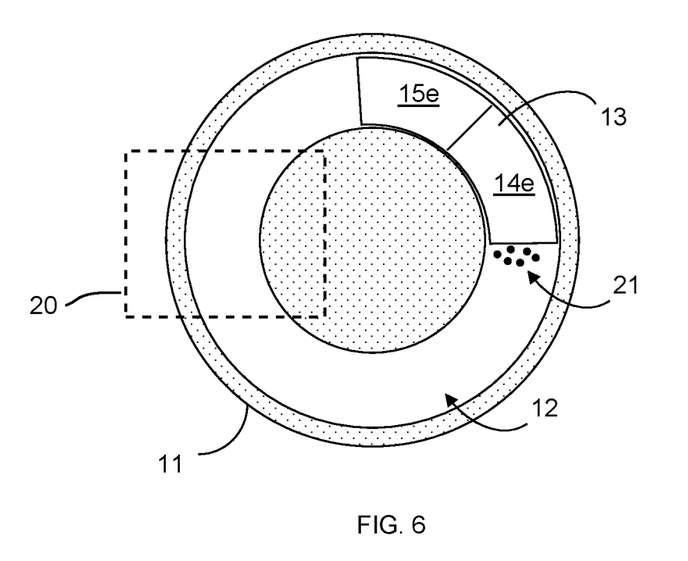
FIG. 6 is a plan view of a fifth embodiment of the invention, showing the actuator of FIG. 5 configured to travel inside a circular chamber.

In other embodiments, rather than being fixed in a stationary position at its center, the actuator 13 may be substantially untethered within the chamber 12. Referring to FIGS. 5 and 6, the actuator 13 may be a freely-moving vehicle with a leading face 14e and a trailing face 15e having the properties described above. The actuator's 13 movement may be constrained by the width and depth of the chamber 12, so that on average the molecular impacts upon the actuator 13 will cause it to move in the direction of the leading face 14e. Referring to FIG. 5, the chamber 12 may comprise a channel 50 in which the actuator 13 is contained, the channel 50 having a start point 51 and an end point 52. The channel 50 may be substantially linear or may define an otherwise regular or irregular path along which the actuator 13 may travel toward the end point 52. The housing 11 may be configured to release the actuator 13, such as by comprising a portal 53 positioned near the end point 52. Referring to FIG. 6, the chamber 12 may be configured as a closed loop around which the actuator 13 travels. The loop is preferably circular as shown, and may alternatively have any shape and comprise any number of bends provided the actuator 13 is able to navigate them. The actuator 13 may have a shape that conforms to the shape of the chamber 12. The actuator 13 may be used to transport a material 21, such as a molecule that is heavier than the molecules of the enclosed gas or fluid, along the path of the chamber 12. For example, the actuator 13 may comprise, carry, push, or pull a drug to be delivered to a cell or one or more magnetic (shown, for example, as material 21 suspended by the fluid in the chamber 12) that may cooperate with an external magnet, inductor, or other external device 20 for generating a magnetic flux change, which may then be converted into electric current. In other embodiments, the actuator 13 may engage a lever or a rotating device such as a turnstile as the actuator 13 travels along a loop. This engagement may mechanically extract energy from the actuator's 13 movement.

Figure 7:
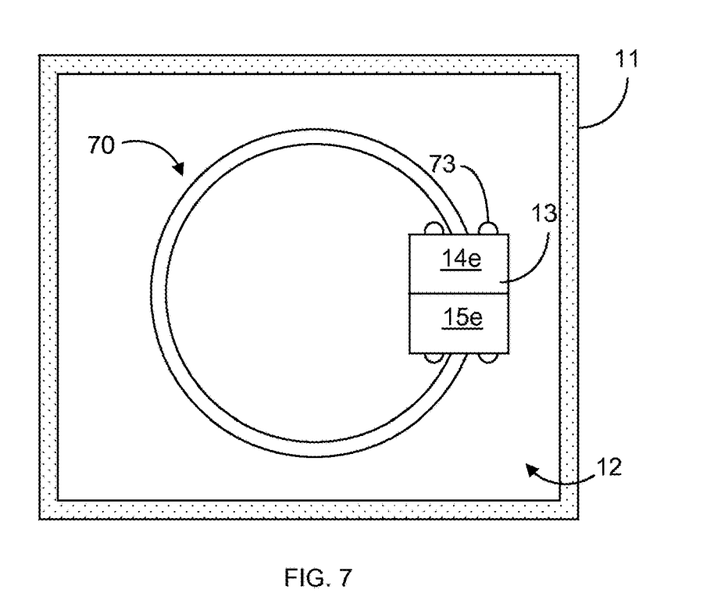
FIG. 7 is a plan view of a sixth embodiment of the invention, showing the actuator of FIG. 5 configured to travel along a circular track.
Figure 8:
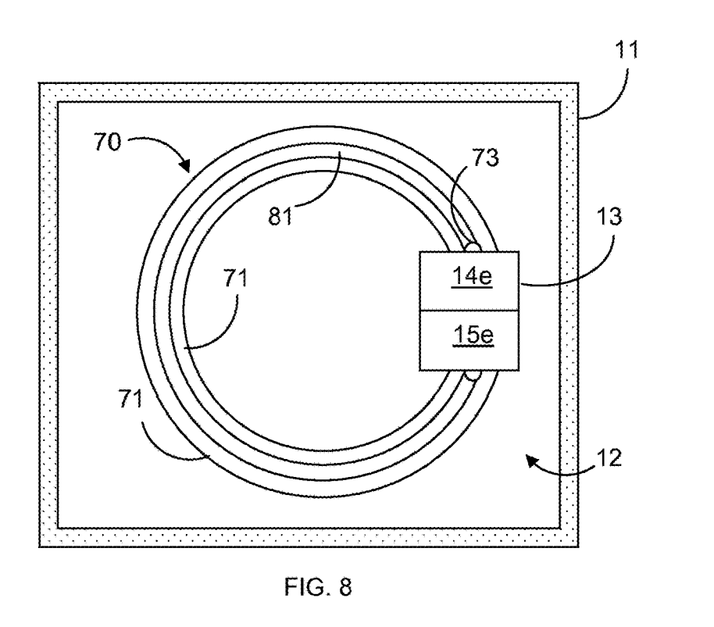
FIG. 8 is a plan view of a seventh embodiment of the invention, showing the actuator of FIG. 5 configured to travel along a circular track having a channel.

Referring to FIGS. 7 and 8, the device 10 may further comprise a track 70 disposed within the chamber 12 and attached to a wall of the housing 11. The actuator 13 travels along the track 70, which is preferably circular but may be oblong, irregular, or any other shape suitable for the actuator 13 to travel along. The track comprises at least one rail 71 that defines the path of the track 70. The actuator 13 comprises one or more guides 73 that cooperate with the rails 71 to keep the actuator 13 on the track 70 as the actuator 13 is propelled by the molecular impacts. In one embodiment, shown in FIG. 7, the actuator 13 comprises a plurality of guides 73 disposed on either side of a single rail 71. In another embodiment, shown in FIG. 8, two concentric rails 71 are spaced apart to create a channel 81, and the actuator 13 comprises one or more guides 73 disposed within the channel 81. The dimensions of the chamber 12 are selected so that the actuator 13 cannot drift off of the track 70. The actuator 13 may be used to transport a material, such as a molecule that is heavier than the molecules of the enclosed gas or fluid, along the path of the chamber 12. For example, the actuator 13 may comprise, carry, push, or pull one or more magnetic materials that may cooperate with an external magnet, inductor, or other device for generating a magnetic flux, which may then be converted into electric current. The device 10 may further comprise other components as described above to mechanically extract energy from the moving actuator 13.

As described above, the net kinetic energy of the actuator 13 can be used to do work through various methods such as direct mechanical coupling to the actuator 13 or by using the motion and magnetic materials to generate an electrical current. It will be understood that a net motion in the desired direction is achieved, but at any particular point in time the actuator 13 may stop or move backwards due to the random Brownian motion of the molecules. Further, it will be understood that the materials and media chosen affect a net force upon the actuator 13 that is greater than any forces imparted by friction, gravity, or drag. The specific implementation and operational characteristics desired will control the primary dimensions and mass of the housing 11, housing walls, chamber 12, and actuator 13, and will also determine the desired pressure of the fluid or gas contained in the chamber 12. Further as explained, the components of the device 10 may be made of a variety of substances. The convenience of silicon as used in integrated circuit manufacturing makes it a good choice for much of the material.

The device 10 may be manufactured using presently known or later developed methods, including those used in MEMS and integrated circuit production, nanoscale metal and carbon manipulation, and biological functions used as a manufacturing template. A single device 10 may be produced at, for example, the nano scale and used to power another piece of nano-scale machinery. Many devices 10 may be physically or electrically connected, functioning as an array that generates an aggregated electrical current or performs work on a macro scale. For example, an array of several million devices 10 may be deposited on the surface of a 1 mm-square microchip. In another example, the array of devices 10 may be etched into a silicon substrate using MEMS construction techniques. In this example the housing 11 is essentially a pit in the substrate, defining a chamber that may have a regular or irregular shape. Electrical design of such an array may include connections and components for stepping up a produced voltage, increasing the current, or modulating or normalizing the current, as is known in the art of electrical circuit design. The microchip may be placed proximate to a computer processor, where waste heat from the processor may excite the molecules in the devices' 10 chambers 12, producing an electric current that then powers a fan, a light-emitting indicator diode, or another electrical component. It is estimated that an array of devices 10 may have a power density of about 5% to 10% that of an alkaline battery.

The device 10 extracts kinetic energy from the molecules in the enclosed gas or fluid, which in turn decreases the average temperature of the gas or fluid. It is estimated that the device will extract about 2% of the initial kinetic energy in the enclosed gas or fluid for every six degrees Celsius lost. After a certain amount of energy is extracted, the gas or fluid may be too cold to move the actuator 13. However, the actuator 13 will move substantially continuously if the device 10 is contained in a gas or fluid having a temperature that is higher than 17 degrees Celsius, due to heat transfer through the housing 11 into the chamber 12. The device 10 may thus be used to dissipate heat contained in its environment, as the kinetic energy of molecules outside the housing 11 is transferred into the device 10.

While there has been illustrated and described what is at present considered to be the preferred embodiment of the present invention, it will be understood by those skilled in the art that various changes and modifications may be made and equivalents may be substituted for elements thereof without departing from the true scope of the invention. Therefore, it is intended that this invention not be limited to the particular embodiment disclosed, but that the invention will include all embodiments falling within the scope of the appended claims.

I claim:

1. A device for converting kinetic energy of molecules in a fluid into useful work, the device comprising:
   a microelectromechanical systems (MEMS) scale or smaller housing comprising walls that define a chamber enclosing the fluid, the walls being made of a heat-transferring material and having a thickness that allows heat to be transferred through the walls into the chamber; and
   at least one actuator that is subject to Brownian motion of the molecules in the fluid, the actuator being contained in the chamber and immersed in the fluid, the actuator configured to transport a magnetic material that cooperates with a component external to the chamber to induce a magnetic flux change when the actuator is in motion; and the actuator comprising:
      a leading face having a first coefficient of restitution with the molecules of the fluid; and
      a trailing face disposed at an angle of more than 180 degrees from the leading face, the leading face and the trailing face being subjected to collisions with the molecules, the trailing face having a second coefficient of restitution with the molecules of the fluid, the second coefficient of restitution being lower than the first coefficient of restitution.

2. The device of claim 1, wherein the chamber has one or both of a width and a depth that constrains the movement of the actuator.

3. The device of claim 2, wherein the chamber comprises a closed loop, and wherein the actuator is constrained to moving around the loop.

4. The device of claim 3, wherein the loop is circular.

5. The device of claim 3, wherein the actuator has a shape that conforms to a shape of the chamber.

6. The device of claim 1, wherein the actuator comprises a blade including one or both of the leading face and the trailing face, the blade being configured to rotate around a center of the actuator.

7. The device of claim 6, wherein the actuator has exactly one blade.

8. The device of claim 6, wherein the leading face is non-parallel to the trailing face, such that the blade ends in a point.

9. The device of claim 6, further comprising an axle disposed at the center of the actuator, the blade being attached to the axle at a proximal end of the blade, being proximal to the axle, wherein the axle rotates when the blade rotates.

10. The device of claim 6, further comprising an axle disposed at the center of the actuator, the blade being attached to the axle at a proximal end of the blade, being proximal to the axle, wherein the axle remains stationary when the blade rotates.

11. The device of claim 1, wherein the actuator comprises a plurality of blades, a first blade of the plurality of blades including the leading face and a second blade of the plurality of blades including the trailing face, the plurality of blades being configured to rotate around a center of the actuator.

12. The device of claim 1, further comprising a silicon substrate, the housing comprising a pit etched into the silicon substrate and defining a portion of the chamber.

13. The device of claim 1, further comprising a mechanism for producing an electric current from the useful work.

14. An apparatus for converting kinetic energy of molecules in a fluid into useful work, the apparatus comprising a plurality of a device as recited in claim 1 connected together to form an array that generates the useful work on a macro scale.

15. The device of claim 1, wherein the actuator comprises one or more blades configured to rotate around a center of the actuator, a first blade of the one or more blades incorporating the leading face and the trailing face and comprising the magnetic material.

16. The device of claim 15, wherein the one or more blades comprise the first blade and a second blade offset 180 degrees from the first blade, the second blade comprising a leading edge having the first coefficient of restitution and a trailing edge having the second coefficient of restitution, a sum of a first mass of the first blade and a second mass of the magnetic material equaling a third mass, the second blade having the third mass.

17. A device for converting kinetic energy of molecules in a fluid into useful work, the device comprising:
   a microelectromechanical systems (MEMS) scale or smaller housing comprising walls that define a chamber enclosing the fluid, the walls being made of a heat-transferring material and having a thickness that allows heat to be transferred through the walls into the chamber;
   at least one actuator that is subject to Brownian motion of the molecules in the fluid, the actuator being contained in the chamber and immersed in the fluid, the actuator configured to transport a magnetic material that cooperates with a component external to the chamber in induce a magnetic flux change when the actuator is in motion; and the actuator comprising:
      an axle disposed at the center of the actuator; and
      a blade being attached to the axle at a proximal end of the blade and configured to rotate around the axle, the axle remaining stationary when the blade rotates, the blade comprising:
         a leading face having a first coefficient of restitution with the molecules of the fluid; and
         a trailing face disposed at an angle of more than 180 degrees from the leading face, the leading face and the trailing face being subjected to collisions with the molecules, the trailing face having a second coefficient of restitution with the molecules of the fluid, the second coefficient of restitution being lower than the first coefficient of restitution.

18. A device for converting kinetic energy of molecules in a fluid into useful work, the device comprising:
   a microelectromechanical systems (MEMS) scale or smaller housing comprising walls that define a chamber enclosing the fluid, the walls being made of a heat-transferring material and having a thickness that allows heat to be transferred through the walls into the chamber;
   a first magnetic material disposed externally to the chamber; and
   at least one actuator that is subject to Brownian motion of the molecules in the fluid, the actuator being contained in the chamber and immersed in the fluid, the actuator configured to transport a second magnetic material within the chamber into cooperation with the first magnetic material to induce a magnetic flux change when the actuator is in motion; and the actuator comprising:

a leading face having a first coefficient of restitution with the molecules of the fluid; and a trailing face disposed at an angle of more than 180 degrees from the leading face, the leading face and the trailing face being subjected to collisions with the molecules, the trailing face having a second coefficient of restitution with the molecules of the fluid, the second coefficient of restitution being lower than the first coefficient of restitution.

19. The device of claim 18, comprising an external component incorporating the first magnetic material and generating an electric current in response to the magnetic flux change.

20. The device of claim 19, wherein the external component is an inductor.

* * * * *